United States Patent [19]
Shirakawa et al.

[11] Patent Number: 5,801,438
[45] Date of Patent: Sep. 1, 1998

[54] SEMICONDUCTOR DEVICE MOUNTING AND MULTI-CHIP MODULE

[75] Inventors: Hirotsugu Shirakawa; Yasunori Tanaka; Tsunenobu Kouda, all of Tokyo, Japan

[73] Assignee: NEC Corporation, Tokyo, Japan

[21] Appl. No.: 663,941

[22] Filed: Jun. 14, 1996

[30] Foreign Application Priority Data

Jun. 16, 1995 [JP] Japan .................. 7-150467

[51] Int. Cl.[6] .............. H01L 23/02; H01L 23/34
[52] U.S. Cl. .............. 257/685; 257/686; 257/678; 257/723
[58] Field of Search .............. 257/685, 686, 257/777, 678, 723

[56] References Cited

U.S. PATENT DOCUMENTS

| | | | |
|---|---|---|---|
| 4,903,120 | 2/1990 | Beene et al. | 257/723 |
| 4,943,844 | 7/1990 | Oscilowski et al. | 257/723 |
| 4,993,148 | 2/1991 | Adachi et al. | 29/852 |
| 5,313,367 | 5/1994 | Ishiyama | 361/772 |
| 5,608,262 | 3/1997 | Degani et al. | 257/723 |

FOREIGN PATENT DOCUMENTS

| | | |
|---|---|---|
| 0645953 | 9/1994 | European Pat. Off. . |
| 57-143848 | 9/1982 | Japan . |
| 60-80232 | 5/1985 | Japan ................. 257/777 |
| 62-232133 | 10/1987 | Japan ................. 257/777 |
| 64-57653 | 3/1989 | Japan . |
| 1-258446 | 10/1989 | Japan . |
| 4-359462 | 12/1992 | Japan . |
| 7-30059 | 1/1995 | Japan . |
| 1195301 | 6/1970 | United Kingdom . |
| 219182 | 12/1986 | United Kingdom . |
| 9503683 | 2/1995 | WIPO . |

*Primary Examiner*—Teresa M. Arroyo
*Attorney, Agent, or Firm*—Sughrue, Mion, Zinn, Macpeak & Seas, PLLC

[57] ABSTRACT

In a multi-chip module, a laminate wiring board is formed with stepped recesses. Electrodes to be connected to the electrodes of a bare-chip semiconductor device are subjected to non-electrolytic gold plating. This realizes wire bonding which is as short in distance and as low in loop as possible. To seal each recess with insulating resin, use is made of screen printing using a mesh screen which has a great aperture ratio and a small thickness.

9 Claims, 3 Drawing Sheets

SEMICONDUCTOR DEVICE MOUNTING AND MULTI-CHIP MODULE

BACKGROUND OF THE INVENTION

The present invention relates to a method of mounting a semiconductor device, and a multi-chip module produced by the same.

A laminate wiring board formed with recesses has been proposed in various forms in the past. For example, Japanese Patent Laid-Open Publication No. 64-57653 teaches a laminate wiring board formed with recesses such that the electrodes of each part and the conductor pattern of the wiring board are flush with each other. This kind of configuration minimizes the distance of connection and is adapted for composite IC (Integrated Circuit) parts.

Japanese Patent Laid-Open Publication No. 1-258446 discloses a laminate thick film wiring board formed with recesses for receiving chips. This kind of configuration is adapted for composite ICs.

Japanese Patent Laid-Open Publication No. 4-359462 discloses a composite IC device formed with recesses in order to protect semiconductor devices from contamination and deterioration due to flux. The recesses are sealed with sealing members.

Japanese Patent Laid-Open Publication No. 7-30059 proposes a multi-chip module having semiconductor devices mounted in the recesses of a laminate wiring board, and packaged semiconductor devices each being mounted over the respective semiconductor device. With this configuration, it is possible to implement a dense and miniature multi-chip module. The recesses and bare-chip semiconductor devices buried in the recesses promote high integration and miniaturization because the area of the wiring board is determined by the area and number of surface mounting parts as represented by packaged semiconductor devices. However, this document does not show or describe how it produces such a module or how it reduces the thickness of the module specifically.

The conventional laminate wiring boards of the kind described above have the following problems left unsolved. The recesses are formed in the wiring board in order to reduce the mounting area, and the bare-chip semiconductor devices are received in the recesses. The prerequisite with this scheme is that resin sealing the recesses be prevented from protruding from the top of the wiring board. This requires the recesses to have a substantial depth and thereby obstructs the reduction of the thickness of the wiring board. Furthermore, to allow each packaged semiconductor device to be mounted while straddling the respective recess, it is necessary to reduce the area of each recess.

SUMMARY OF THE INVENTION

It is therefore an object of the present invention to provide a highly integrated, thin and light weight multi-chip module, and a method of mounting a semiconductor device for producing such a module.

In accordance with the present invention, a method of mounting a semiconductor device on a laminate wiring board has the steps of (a) forming a recess or a through hole in the laminate wiring board, and (b) sealing the recess or the through hole with sealing resin. The step (b) has the steps of (c) providing the recess or the through hole with a stepped configuration, and performing screen printing using a mesh screen having a relatively great aperture ratio and a relatively small thickness, and (d) performing wire bonding as short in distance and as low in loop as possible.

Also, in accordance with the present invention, a multi-chip module has a plurality of surface mounting parts as represented by packaged semiconductor devices, a plurality of bare-chip semiconductor devices, and a laminate wiring board. The laminate wiring board is formed with a plurality of recesses. The plurality of bare-chip semiconductor device are each mounted in the respective recess and sealed by resin.

Further, in accordance with the present invention, a multi-chip module has a plurality of surface mounting parts as represented by packaged semiconductor devices, a plurality of bare-chip semiconductor devices, and a laminate wiring board. The wiring board is formed with a plurality of through holes. The plurality of bare chips are each mounted in the respective recess and sealed therein.

BRIEF DESCRIPTION OF THE DRAWINGS

The above and other objects, features and advantages of the present invention will become apparent from the following detailed description taken with the accompanying drawings in which.

DESCRIPTION OF THE PREFERRED EMBODIMENTS

Figure 1:
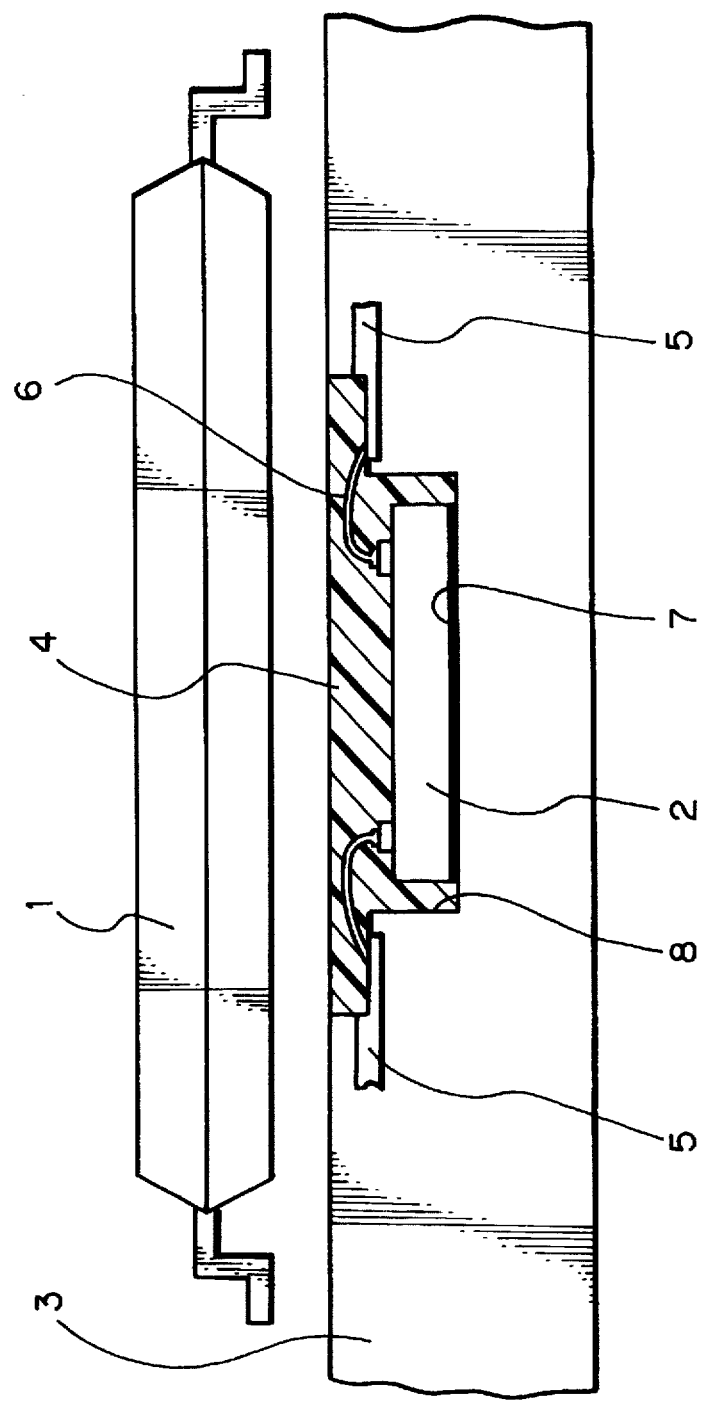
FIG. 1 is a vertical section showing a multi-chip module embodying the present invention.

Referring to FIG. 1 of the drawings, a multi-chip module embodying the present invention is shown. In FIG. 1, a packaged semiconductor device 1 is shown as being spaced above a laminate wiring board 3 in a particular assembly stage. The wiring board 3 is formed with a plurality of stepped recesses 8 (only one is shown). The stepped recesses 8 each has a lower layer and an upper layer. A bare-chip semiconductor device 2 is affixed to the wiring board 3 by adhesive 7 in the lower layer of each recess 8. Electrodes 5 provided on the wiring board 3 are connected to the electrodes of the semiconductor device 2 in the upper layer of the recess 8.

The electrodes 5 of the wiring board 3 are subjected to non-electrolytic gold plating for the following reasons. Electrolytic plating would cause the electrodes 5 to protrude from the side walls of the recess 8 and might cause them to contact the side edges of the semiconductor device 2, resulting in short-circuiting. If sufficient distances were provided between the side walls of the recess 8 and those of the semiconductor device 2 in order to avoid the above short-circuiting, the area of the recess 8 would be undesirably increased.

How the embodiment mounts the semiconductor devices 1 and 2 will be described with reference to FIG. 1. First, the bare-chip semiconductor device 2 is mounted in the lower layer of the recess 8. Then, the electrodes of the semiconductor device 2 and the electrodes 5 of the wiring board 3 are connected together by wire bonding using gold, copper or aluminum wires 6.

The semiconductor device 2 mounted in the recess 8 is sealed by insulating resin 4. For example, assume that the packaged semiconductor device 1 is a TSOP or a TQFP package whose mounting height is limited to 1.27 mm. Then, the distance between the bottom of the semiconductor device 1 and the top of the wiring board 3 is limited to 0.05±0.05 mm. In this condition, it is quite likely that the bottom of the semiconductor device 1 contacts the top of the wiring board 3.

If the insulating resin 4 sealing the recess 8 protrudes from the top of the wiring board 3, it will contact the bottom of the semiconductor device 1 and will thereby raise leads away from lands provided on the wiring board 3, resulting in defective soldering. In light of this, the illustrative embodiment uses screen printing for the purpose of feeding the resin 4 in a preselected constant amount. To promote the smooth delivery of the resin 4, use is made of a screen mesh having a great aperture ratio. The mesh screen should preferably be as thin as possible in order to realize a sealing height of less than 50 µm.

To effectively use the wiring board 3, the packaged semiconductor device 1 or similar comparatively large sized part is mounted on the wiring board 3 in such a manner as to straddle the recess 8. In this sense, the area of the recess 8 should preferably be small, as stated earlier. Because the area of the recess 8 cannot be decreased below the area of the semiconductor device 2, implementing short distance, low loop bonding is important. In the illustrative embodiment, the layer of the wiring board 3 in which the electrodes 5 are formed is positioned about 10 µm higher in level than the electrode plane of the semiconductor device 2. This successfully reduces the distance of connection.

Figure 3:
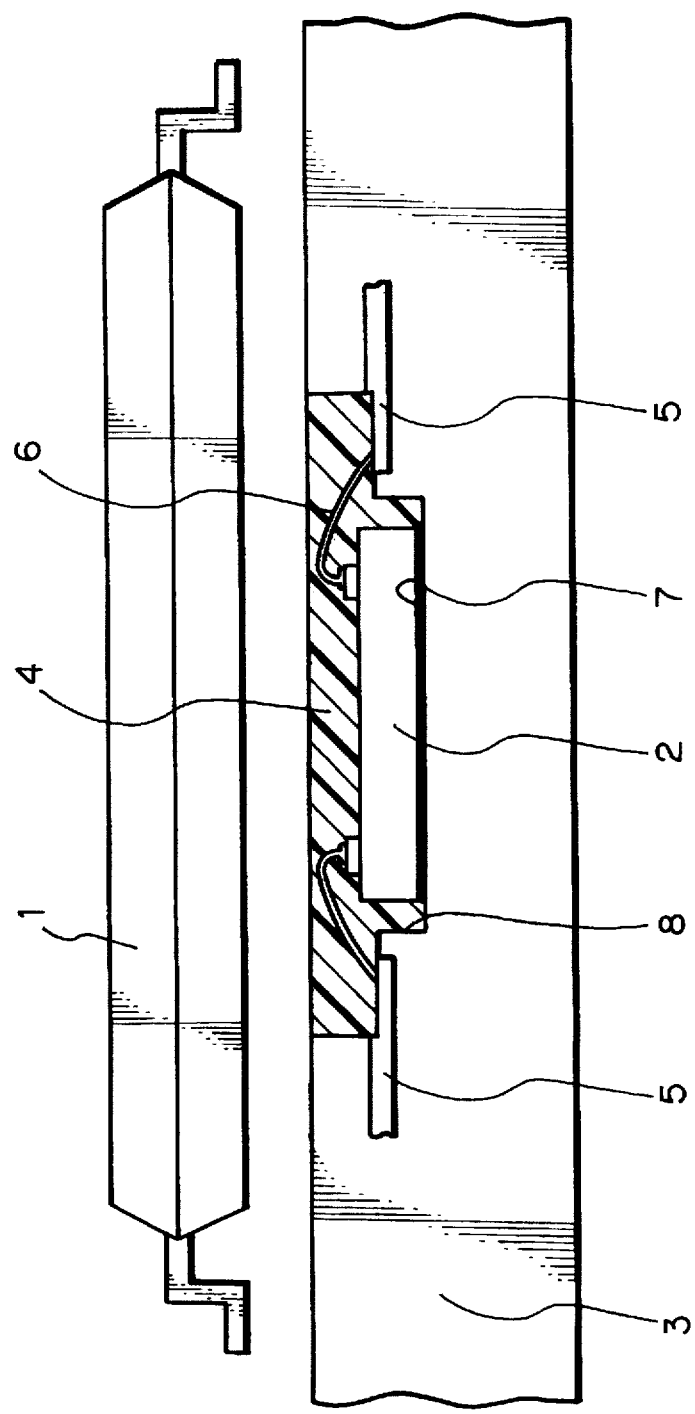
FIG. 3 is a vertical section showing another alternative embodiment of the present invention.

FIG. 3 shows a second embodiment of the present invention. As shown, with the state-of-the-art bonding technologies, lower loop bonding is achievable when the electrode plane of the semiconductor device 2 is increased in height. The rest of the configuration is identical with the embodiment shown in FIG. 1.

Figure 2:
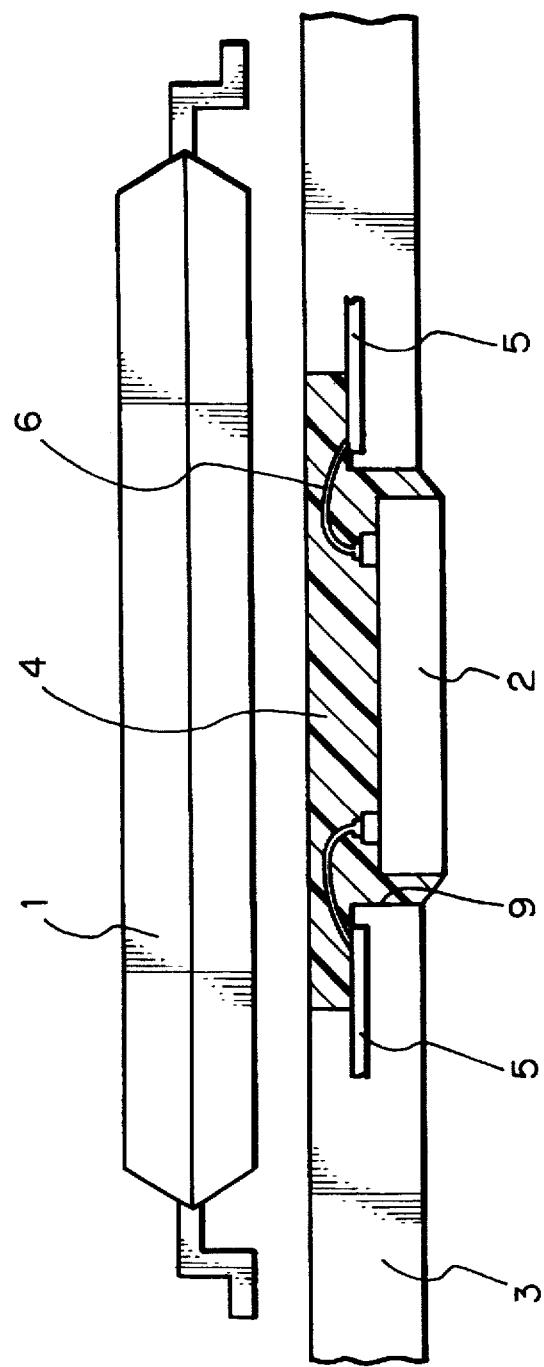
FIG. 2 is a vertical section showing an alternative embodiment of the present invention.

FIG. 2 shows another alternative embodiment of the present invention similar to the foregoing embodiments except for the following. As shown, when the laminate wiring board 3 is too thin to form the stepped recess, the stepped recess is replaced with a through hole 9. In this embodiment, the adhesive 7 of the previous embodiments is replaced with vacuum suction. Specifically, to affix the semiconductor device 2 to the wiring board 3, the device is sucked from below. The rest of the configuration is identical with the embodiment shown in FIG. 1.

In summary, in accordance with the present invention, a laminate wiring board is formed with stepped recesses. Electrodes to be connected to the electrodes of a bare-chip semiconductor device are subjected to non-electrolytic gold plating. This realizes wire bonding which is as short in distance and as low in loop as possible. To seal each recess with insulating resin, use is made of screen printing using a mesh screen which has a great aperture ratio and a small thickness. Therefore, each recess can have its depth and size respectively limited to about +200 µm and about +4 mm which are the thickness and size of the chip. That is, dimensions for mounting a packaged semiconductor device, which is one of surface mounting parts occupying comparatively broad areas, in a laminated wiring board as a bare-chip semiconductor device can be defined. As a result, the laminate wiring board is reduced in size and thickness.

Various modifications will become possible for those skilled in the art after receiving the teachings of the present disclosure without departing from the scope thereof.

What is claimed is:

1. A multi-chip module comprising:
   a surface mounting part as represented by a packaged semiconductor device;
   a bare-chip semiconductor device;
   a laminate wiring board;
   wherein said laminate wiring board is formed with a recess;
   wherein said bare-chip semiconductor device is mounted in said recess and sealed by resin;
   wherein said recess has a depth about 200 µm greater than a thickness of said bare-chip semiconductor device; and
   wherein said packaged semiconductor device is mounted to said laminate wiring board.

2. A multi-chip module comprising:
   a laminate wiring board;
   a surface mounting part, as represented by a packaged semiconductor device, mounted to said wiring board; and
   a bare-chip semiconductor device;
   wherein said wiring board comprises a through hole, said bare-chip semiconductor device is mounted to said wiring board in said through hole and sealed therein by a resin, said through hole is larger than said bare-chip semiconductor device, and said bare-chip semiconductor device passes through said through hole; and
   wherein said recess has an areal dimension about 4 mm greater than the areal dimension of said bare-chip semiconductor device.

3. A module as claimed in claim 2, wherein said through hole has a stepped configuration and includes an upper portion which is larger than a lower portion.

4. A module as claimed in claim 1, wherein said recess has an areal dimension about 4 mm greater than the areal dimension of said bare-chip semiconductor device.

5. A multi-chip module comprising:
   a surface mounting part as represented by a packaged semiconductor device;
   a bare-chip semiconductor device;
   a laminate wiring board;
   wherein said laminate wiring board is formed with a recess having a stepped configuration and including a lower portion having a depth greater than a thickness of said bare-chip semiconductor device;
   wherein said bare-chip semiconductor device is mounted in said recess and sealed by a resin;
   wherein said packaged semiconductor device is mounted to said laminate wiring board; and
   wherein said recess has an areal dimension about 4 mm greater than the areal dimension of said bare-chip semiconductor device.

6. A module as claimed in claim 1, wherein said resin projects less than 50 µm above an upper surface of said recess.

7. A multi-chip module comprising:
   a surface mounting part as represented by a packaged semiconductor device;
   a bare-chip semiconductor device;
   a laminate wiring board;
   wherein said laminate wiring board is formed with a recess having a stepped configuration and including a lower portion having a depth greater than a thickness of said bare-chip semiconductor device;
   wherein said bare-chip semiconductor device is mounted in said recess and sealed by a resin; and
   wherein said packaged semiconductor device is mounted to said laminate wiring board; and wherein said resin projects less than 50 μm above an upper surface of said recess.

8. A module as claimed in claim 2, wherein said resin projects less than 50 μm above an upper surface of said through hole.

9. A multi-chip module comprising:

a laminate wiring board;

a surface mounting part, as represented by a packaged semiconductor device, mounted to said wiring board; and a bare-chip semiconductor device;

wherein said wiring board comprises a through hole, said bare-chip semiconductor device is mounted to said wiring board in said through hole and sealed therein by a resin, said through hole is larger than said bare-chip semiconductor device, and said bare-chip semiconductor device passes through said through hole; and wherein said through hole has an areal dimension about 4 mm greater than the areal dimension of said bare-chip semiconductor device.

* * * * *